US007880861B2

(12) United States Patent
Pouls

(10) Patent No.: US 7,880,861 B2
(45) Date of Patent: Feb. 1, 2011

(54) SYNCHRONIZING TIMING OF MULTIPLE PHYSICALLY OR LOGICALLY SEPARATED SYSTEM NODES

(75) Inventor: Roel Franciscus Gerardus Pouls, Belfeld (NL)

(73) Assignee: ASML Netherlands B.V., Veldhoven (NL)

( * ) Notice: Subject to any disclaimer, the term of this patent is extended or adjusted under 35 U.S.C. 154(b) by 781 days.

(21) Appl. No.: 11/840,714

(22) Filed: Aug. 17, 2007

(65) Prior Publication Data
US 2009/0046264 A1 Feb. 19, 2009

(51) Int. Cl.
G03B 27/42 (2006.01)
G03B 27/68 (2006.01)
G03B 27/32 (2006.01)

(52) U.S. Cl. .............................. 355/53; 355/52; 355/77

(58) Field of Classification Search .................. 355/52, 355/53, 77, 133; 375/356; 340/825.2; 713/375; 709/248; 700/121; 370/503, 507, 230, 230.1, 370/232, 236, 516; 398/3, 4
See application file for complete search history.

(56) References Cited

U.S. PATENT DOCUMENTS

| 4,982,185 A | | 1/1991 | Holmberg et al. |
| 5,276,659 A | | 1/1994 | Kotaki |
| 5,499,275 A | * | 3/1996 | Kishi ........................ 375/357 |
| 5,519,877 A | | 5/1996 | Yoneda et al. |
| 5,990,638 A | | 11/1999 | Aoyama et al. |
| 5,999,244 A | * | 12/1999 | Yanagihara et al. ............ 355/53 |
| 6,005,902 A | * | 12/1999 | Bortolini et al. ............. 375/356 |
| 6,157,395 A | | 12/2000 | Alcorn |
| 6,185,217 B1 | * | 2/2001 | Ando et al. .................. 370/403 |
| 6,674,730 B1 | | 1/2004 | Moerder |
| 6,757,546 B1 | | 6/2004 | Hagen et al. |
| 6,779,123 B2 | | 8/2004 | Simon et al. |
| 6,854,019 B2 | | 2/2005 | Egle |
| 7,343,437 B2 | * | 3/2008 | Kynast et al. ................ 710/110 |
| 2002/0031199 A1 | * | 3/2002 | Rolston et al. .............. 375/356 |
| 2004/0223515 A1 | * | 11/2004 | Rygielski et al. ............ 370/503 |
| 2004/0239904 A1 | | 12/2004 | Nishinaga |
| 2007/0035713 A1 | * | 2/2007 | Shibayama .................. 355/72 |

(Continued)

FOREIGN PATENT DOCUMENTS

WO  WO 2008/039663 A1  4/2008

OTHER PUBLICATIONS

Mills, David L., "Improved Algorithms for Synchronizing Computer Network Clocks", IEEE/ACM Transactions on Networking, vol. 3, No. 3, Jun. 1995, pp. 245-254.

(Continued)

Primary Examiner—Peter B Kim
Assistant Examiner—Christina Riddle
(74) Attorney, Agent, or Firm—Sterne, Kessler, Goldstein & Fox P.L.L.C.

(57) ABSTRACT

A method for synchronizing a plurality of series coupled nodes is described. A master trigger is transmitted through the plurality of series coupled local nodes in a downstream direction from a first node to a last node and retransmitted through the plurality of series coupled nodes in an upstream direction from the last node to the first node. Then, a local synchronization time is calculated at each of the plurality of series coupled nodes based on a differential measurement between the arrival of the master trigger in the downstream direction and the upstream direction. Operations in the local nodes may be synchronized based on the local synchronization time.

20 Claims, 12 Drawing Sheets

U.S. PATENT DOCUMENTS

2008/0232525 A1* 9/2008 Nakayama et al. .......... 375/356

OTHER PUBLICATIONS

International Search Report for Application No. PCT/EP2008/006664 mailed Nov. 14, 2008, 8 pgs.

Garner, Geoffrey M., "Description of Use of IEEE 1588 Peer-to-Peer Transparent Clock in A/V Bridging Networks", Revision 2.0, May 12, 2006, 38 pgs.

* cited by examiner

SYNCHRONIZING TIMING OF MULTIPLE PHYSICALLY OR LOGICALLY SEPARATED SYSTEM NODES

BACKGROUND

1. Field of the Invention

The present invention generally relates to a lithographic apparatus and a method for manufacturing a device. More specifically, the invention relates to a system and method for synchronizing elements of a system for controlling the lithographic apparatus.

2. Related Art

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, a patterning device, which can be referred to as a mask or a reticle, can be used to generate a circuit pattern corresponding to an individual layer of a flat panel display (or other device). This pattern can be transferred onto all or part of the substrate (e.g., a glass plate), by imaging onto a layer of radiation-sensitive material (e.g., resist) provided on the substrate.

Instead of a circuit pattern, the patterning device can be used to generate other patterns, for example a color filter pattern or a matrix of dots. Instead of a mask, the patterning device can be a patterning array that comprises an array of individually controllable elements. The pattern can be changed more quickly and for less cost in such a system compared to a mask-based system. For example, a patterning device can flexibly alter the exposure region on a substrate to accommodate the manufacture of various shapes.

For instance, a flat panel display substrate is typically rectangular in shape. A lithographic apparatus designed to expose a substrate of this type can provide an exposure region that covers a full width of the rectangular substrate, or covers a portion of the width (for example half of the width). The substrate can be scanned underneath the exposure region, while the mask or reticle is synchronously scanned through a beam. In this way, the pattern is transferred to the substrate. If the exposure region covers the full width of the substrate then exposure can be completed with a single scan. If the exposure region covers, for example, half of the width of the substrate, then the substrate can be moved transversely after the first scan, and a further scan is typically performed to expose the remainder of the substrate.

A lithographic apparatus will have a variety of subsystems and processes that need to be precisely synchronized. At a macro level, for instance, a projection system including a light source such as a laser beam, a patterning device, substrate stage and/or a patterning device stage must all be tightly synchronized in any specific application. At a finer level, the flow of data throughout the lithographic apparatus must be tightly synchronized to ensure that exposure periods are precisely aligned with the patterning device. This is especially true in optical maskless lithography (OML) lithographic tools that use the above mentioned patterning device that comprises an array of individually controllable elements. Such patterning devices typically have a plurality of controlling devices, drivers and data stores, all of which must remain tightly synchronized to maximize throughput and minimize errors.

Very accurate synchronization of multiple systems is difficult, especially if the parts of the lithographic apparatus are physically installed outside the actual fabrication room. For maskless systems, this is typically the case due to heat regulation issues, physical constraints and price per square meter in the clean room environment.

SUMMARY

A system and method that is able to effectively synchronize various systems and subsystems in a lithographic apparatus is provided.

In one embodiment of the present invention, there is provided a method for synchronizing a plurality of series coupled nodes. A master trigger is transmitted through the plurality of series coupled nodes in a downstream direction from a first node to a last node and retransmitted through the plurality of series coupled nodes in an upstream direction from the last node to the first node. Then, a local synchronization time is calculated at each of the plurality of series coupled nodes based on a differential measurement between the arrival of the master trigger in the downstream direction and the upstream direction.

In another embodiment, a synchronized system for controlling a patterning device is described. The system comprises a controller node that includes a transmitter that transmits a downstream master trigger, and a receiver that receives an upstream master trigger. The system further includes a one or more successive downstream local nodes coupled in series with the master node, each of the one or more local nodes has a downstream transceiver that receives and retransmits the master trigger in a downstream direction, and an upstream transceiver that receives and retransmits the master trigger in an upstream direction. The controller node and the one or more local nodes each include (i) a trigger detector that detects an arrival of the master trigger in both the downstream direction and the upstream direction, and (ii) a timing compensation module that generates a local timing signal based on a differential measurement between the arrival of the master trigger in the upstream direction and the arrival of the master trigger in the downstream direction. The local timing signals are synchronized with the master signal to control operation of the patterning device.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

Figure 1:
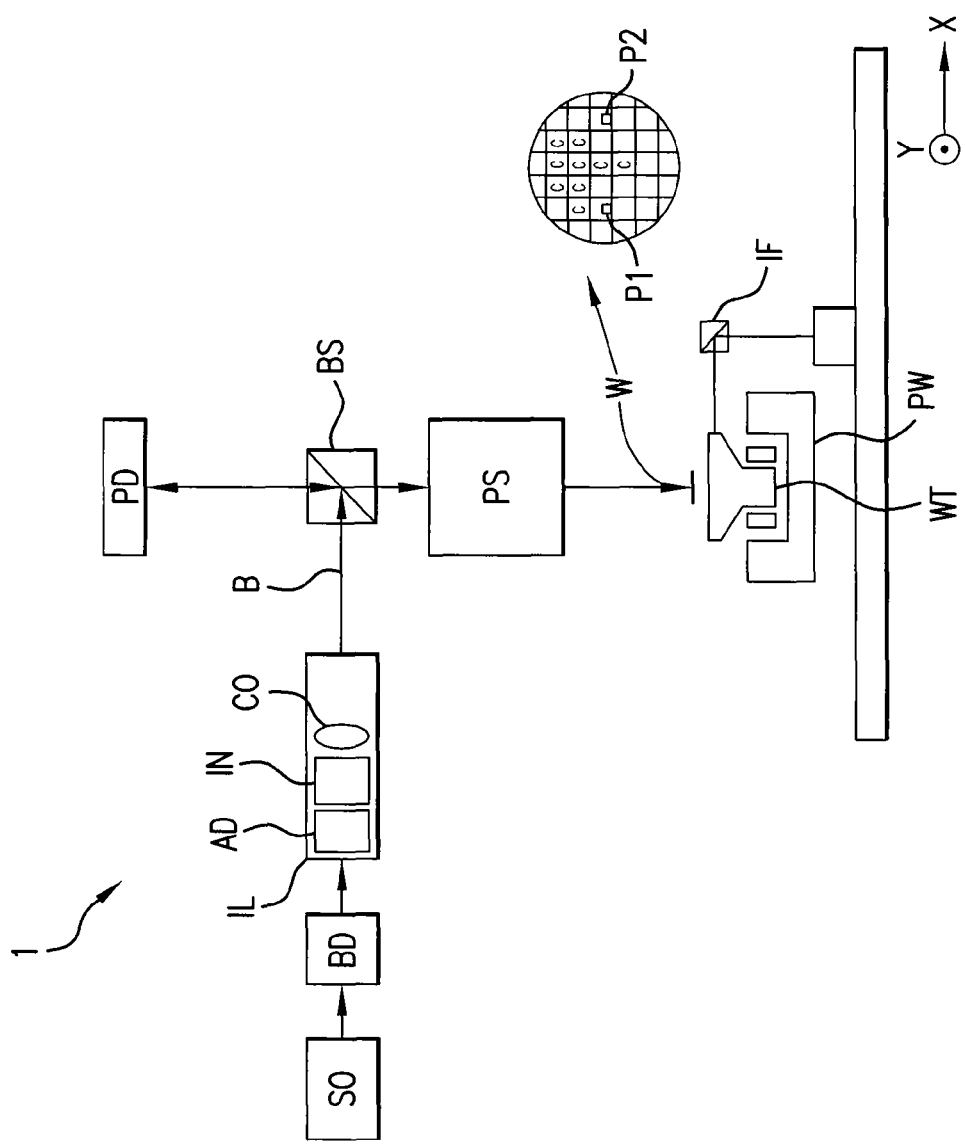
FIGS. 1 and 2 depict lithographic apparatus, according to various embodiments of the present invention.

One or more embodiments of the present invention will now be described with reference to the accompanying drawings. In the drawings, like reference numbers may indicate identical or functionally similar elements. Additionally, the left-most digit(s) of a reference number can identify the drawing in which the reference number first appears.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment cannot necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

FIG. 1 schematically depicts the lithographic apparatus 1 of one embodiment of the invention. The apparatus comprises an illumination system IL, a patterning device PD, a substrate table WT, and a projection system PS. The illumination system (illuminator) IL is configured to condition a radiation beam B (e.g., UV radiation).

It is to be appreciated that, although the description is directed to lithography, the patterned device PD can be formed in a display system (e.g., in a LCD television or projector), without departing from the scope of the present invention. Thus, the projected patterned beam can be projected onto many different types of objects, e.g., substrates, display devices, etc.

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the array of individually controllable elements onto a target portion C (e.g., comprising one or more dies) of the substrate W. The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The illumination system can include various types of optical components, such as refractive, reflective, magnetic, electromagnetic, electrostatic or other types of optical components, or any combination thereof, for directing, shaping, or controlling radiation.

The patterning device PD (e.g., a reticle or mask or an array of individually controllable elements) modulates the beam. In general, the position of the array of individually controllable elements will be fixed relative to the projection system PS. However, it can instead be connected to a positioner configured to accurately position the array of individually controllable elements in accordance with certain parameters.

The term "patterning device" or "contrast device"—e.g., such as a mirror device or a mirror array—used herein should be broadly interpreted as referring to any device that can be used to modulate the cross-section of a radiation beam, such as to create a pattern in a target portion of the substrate. The devices can be either static patterning devices (e.g., masks or reticles) or dynamic (e.g., arrays of programmable elements) patterning devices. For brevity, most of the description will be in terms of a dynamic patterning device, however it is to be appreciated that a static pattern device can also be used without departing from the scope of the present invention.

It should be noted that the pattern imparted to the radiation beam cannot exactly correspond to the desired pattern in the target portion of the substrate, for example if the pattern includes phase-shifting features or so called assist features. Similarly, the pattern eventually generated on the substrate cannot correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include reticles, programmable mirror arrays, laser diode arrays, light emitting diode arrays, grating light valves, and LCD arrays.

Patterning devices whose pattern is programmable with the aid of electronic means (e.g., a computer), such as patterning devices comprising a plurality of programmable elements (e.g., all the devices mentioned in the previous sentence except for the reticle), are collectively referred to herein as "contrast devices." The patterning device comprises at least 10, at least 100, at least 1,000, at least 10,000, at least 100,000, at least 1,000,000, or at least 10,000,000 programmable elements.

A programmable mirror array can comprise a matrix-addressable surface having a viscoelastic control layer and a reflective surface. The basic principle behind such an apparatus is that addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (micro-electro-mechanical system devices) can also be used in a corresponding manner. In one example, a diffractive optical MEMS device is composed of a plurality of reflective ribbons that can be deformed relative to one another to form a grating that reflects incident light as diffracted light.

A further alternative example of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam in a different direction than unaddressed mirrors; in this manner, the reflected beam can be patterned according to the addressing pattern of the matrix-addressable mirrors. The required matrix addressing can be performed using suitable electronic means.

Another example PD is a programmable LCD array.

The lithographic apparatus can comprise one or more contrast devices. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements, and/or a common projection system (or part of the projection system).

In one example, such as the embodiment depicted in FIG. 1, the substrate W has a substantially circular shape, optionally with a notch and/or a flattened edge along part of its perimeter. In another example, the substrate has a polygonal shape, e.g., a rectangular shape.

Examples where the substrate has a substantially circular shape include examples where the substrate has a diameter of at least 25 mm, at least 50 mm, at least 75 mm, at least 100 mm, at least 125 mm, at least 150 mm, at least 175 mm, at least 200 mm, at least 250 mm, or at least 300 mm. Alternatively, the substrate has a diameter of at most 500 mm, at most 400 mm, at most 350 mm, at most 300 mm, at most 250 mm, at most 200 mm, at most 150 mm, at most 100 mm, or at most 75 mm.

Examples where the substrate is polygonal, e.g., rectangular, include examples where at least one side, at least 2 sides or at least 3 sides, of the substrate has a length of at least 5 cm, at least 25 cm, at least 50 cm, at least 100 cm, at least 150 cm, at least 200 cm, or at least 250 cm.

At least one side of the substrate has a length of at most 1000 cm, at most 750 cm, at most 500 cm, at most 350 cm, at most 250 cm, at most 150 cm, or at most 75 cm.

In one example, the substrate W is a wafer, for instance a semiconductor wafer. The wafer material can be selected from the group consisting of Si, SiGe, SiGeC, SiC, Ge, GaAs, InP, and InAs. The wafer can be: a III/V compound semiconductor wafer, a silicon wafer, a ceramic substrate, a glass substrate, or a plastic substrate. The substrate can be transparent (for the naked human eye), colored, or absent a color.

The thickness of the substrate can vary and, to an extent, can depend on the substrate material and/or the substrate dimensions. The thickness can be at least 50 µm, at least 100 µm, at least 200 µm, at least 300 µm, at least 400 µm, at least 500 µm, or at least 600 µm. Alternatively, the thickness of the substrate can be at most 5000 µm, at most 3500 µm, at most 2500 µm, at most 1750 µm, at most 1250 µm, at most 1000 µm, at most 800 µm, at most 600 µm, at most 500 µm, at most 400 µm, or at most 300 µm.

The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements such as a micro lens array (known as an MLA) or a Fresnel lens array to form the secondary sources and to image spots onto the substrate. The array of focusing elements (e.g., MLA) comprises at least 10 focus elements, at least 100 focus elements, at least 1,000 focus elements, at least 10,000 focus elements, at least 100,000 focus elements, or at least 1,000,000 focus elements.

The number of individually controllable elements in the patterning device is equal to or greater than the number of focusing elements in the array of focusing elements. One or more (e.g., 1,000 or more, the majority, or each) of the focusing elements in the array of focusing elements can be optically associated with one or more of the individually controllable elements in the array of individually controllable elements, with 2 or more, 3 or more, 5 or more, 10 or more, 20 or more, 25 or more, 35 or more, or 50 or more of the individually controllable elements in the array of individually controllable elements.

The MLA can be movable (e.g., with the use of one or more actuators) at least in the direction to and away from the substrate. Being able to move the MLA to and away from the substrate allows, e.g., for focus adjustment without having to move the substrate.

Figure 2:
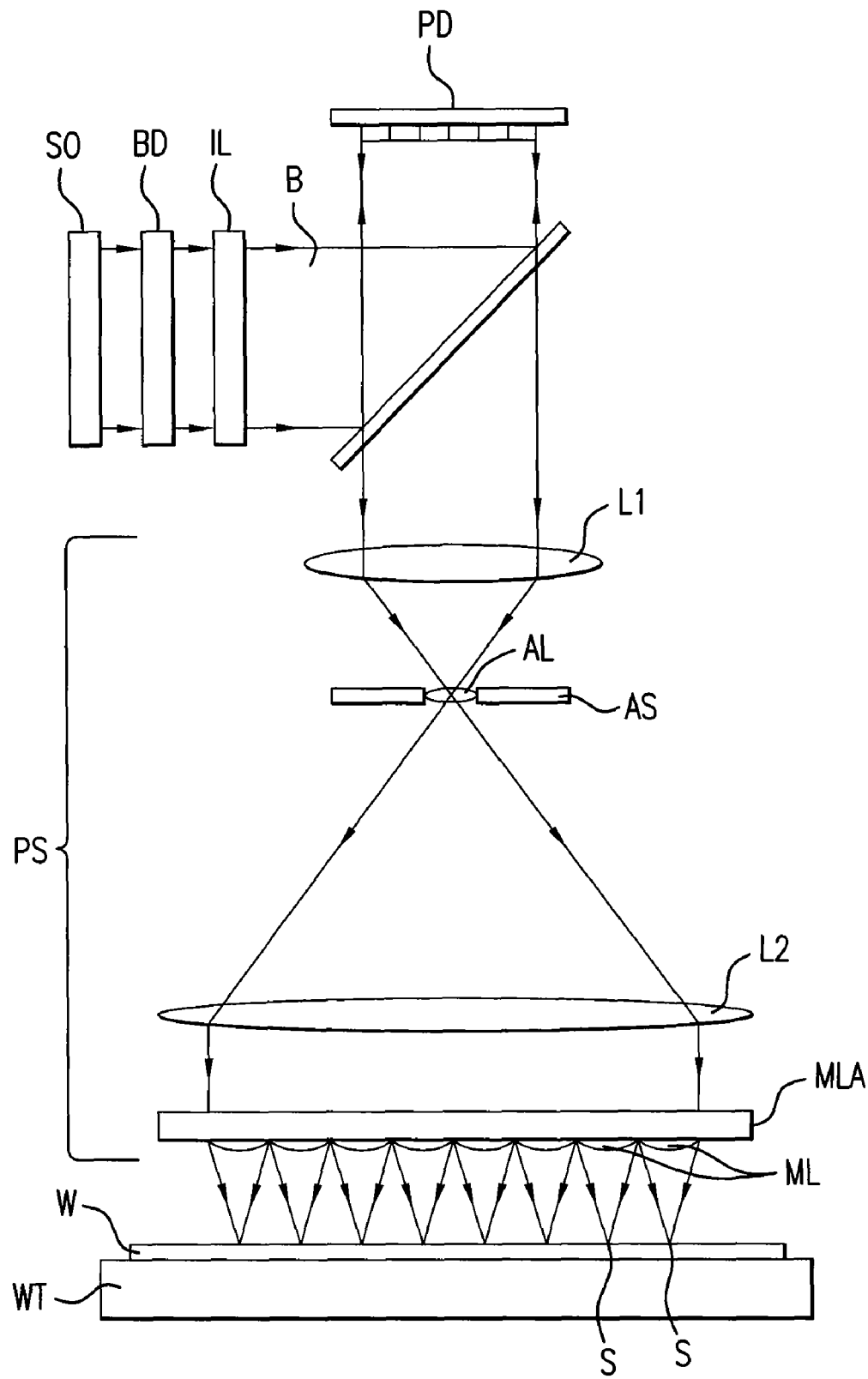

As herein depicted in FIGS. 1 and 2, the apparatus is of a reflective type (e.g., employing a reflective array of individually controllable elements). Alternatively, the apparatus can be of a transmission type (e.g., employing a transmission array of individually controllable elements).

The lithographic apparatus can be of a type having two (dual stage) or more substrate tables. In such "multiple stage" machines, the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. The radiation source provides radiation having a wavelength of at least 5 nm, at least 10 nm, at least 11-13 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. Alternatively, the radiation provided by radiation source SO has a wavelength of at most 450 nm, at most 425 nm, at most 375 nm, at most 360 nm, at most 325 nm, at most 275 nm, at most 250 nm, at most 225 nm, at most 200 nm, or at most 175 nm. The radiation can have a wavelength including 436 nm, 405 nm, 365 nm, 355 nm, 248 nm, 193 nm, 157 nm, and/or 126 nm.

The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable elements of the array of individually controllable elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF2 (e.g., an interferometric device, linear encoder, capacitive sensor, or the like), the substrate table WT can be moved accurately, e.g., so as to position different target portions C in the path of the radiation beam B. Where used, the positioning means for the array of individually controllable elements can be used to correct accurately the position of the patterning device PD with respect to the path of the beam B. e.g., during a scan.

In one example, movement of the substrate table WT is realized with the aid of a long-stroke module (course positioning) and a short-stroke module (fine positioning), which are not explicitly depicted in FIG. 1. In another example, a short stroke stage cannot be present. A similar system can also be used to position the array of individually controllable elements. It will be appreciated that the beam B can alternatively/additionally be moveable, while the object table and/or the array of individually controllable elements can have a fixed position to provide the required relative movement. Such an arrangement can assist in limiting the size of the apparatus. As a further alternative, which can, e.g., be applicable in the manufacture of flat panel displays, the position of the substrate table WT and the projection system PS can be fixed and the substrate W can be arranged to be moved relative to the substrate table WT. For example, the substrate table WT can be provided with a system for scanning the substrate W across it at a substantially constant velocity.

As shown in FIG. 1, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. The beam of radiation can be directed at the patterning device at an angle between 0 and 90°, between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 1 cannot be required if a transmission patterning device is used.

The depicted apparatus can be used in several modes:

1. In step mode, the array of individually controllable elements and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e., a single dynamic exposure). The velocity and direction of the substrate relative to the array of individually controllable elements can be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the beam B is caused to scan a line across the substrate W. The pattern on the array of individually controllable elements is updated as required between pulses of the radiation system and the pulses are timed such that successive target portions C are exposed at the required locations on the substrate W. Consequently, the beam B can scan across the substrate W to expose the complete pattern for a strip of the substrate. The process is repeated until the complete substrate W has been exposed line by line.

4. Continuous scan mode is essentially the same as pulse mode except that the substrate W is scanned relative to the modulated beam of radiation B at a substantially constant speed and the pattern on the array of individually controllable elements is updated as the beam B scans across the substrate W and exposes it. A substantially constant radiation source or a pulsed radiation source, synchronized to the updating of the pattern on the array of individually controllable elements, can be used.

5. In pixel grid imaging mode, which can be performed using the lithographic apparatus of FIG. 2, the pattern formed on substrate W is realized by subsequent exposure of spots formed by a spot generator that are directed onto patterning device PD. The exposed spots have substantially the same shape. On substrate W the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern can be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

In practice, the radiation dose at the edges of a pattern feature does not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence the precise position of the pattern feature boundary, can be controlled more precisely by setting the individually controllable elements that provide radiation to points on the substrate that are on or near the pattern feature boundary. These can be not only to maximum or minimum intensity levels, but also to intensity levels between the maximum and minimum intensity levels. This is commonly referred to as "grayscaling."

Grayscaling provides greater control of the position of the pattern feature boundaries than is possible in a lithography system in which the radiation intensity provided to the substrate by a given individually controllable element can only be set to two values (e.g., just a maximum value and a minimum value). At least 3, at least 4 radiation intensity values, at least 8 radiation intensity values, at least 16 radiation intensity values, at least 32 radiation intensity values, at least 64 radiation intensity values, at least 128 radiation intensity values, or at least 256 different radiation intensity values can be projected onto the substrate.

It should be appreciated that grayscaling can be used for additional or alternative purposes to that described above. For example, the processing of the substrate after the exposure can be tuned, such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling can be used to provide a radiation dose profile across the substrate having more than two desired dose levels. The radiation dose profile can have at least 2 desired dose levels, at least 3 desired radiation dose levels, at least 4 desired radiation dose levels, at least 6 desired radiation dose levels or at least 8 desired radiation dose levels.

It should further be appreciated that the radiation dose profile can be controlled by methods other than by merely controlling the intensity of the radiation received at each point on the substrate, as described above. For example, the radiation dose received by each point on the substrate can alternatively or additionally be controlled by controlling the duration of the exposure of the point. As a further example, each point on the substrate can potentially receive radiation in a plurality of successive exposures. The radiation dose received by each point can, therefore, be alternatively or additionally controlled by exposing the point using a selected subset of the plurality of successive exposures.

FIG. 2 depicts an arrangement of the apparatus according to the present invention that can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

As shown in FIG. 2, the projection system PS includes a beam expander, which comprises two lenses L1, L2. The first lens L1 is arranged to receive the modulated radiation beam B and focus it through an aperture in an aperture stop AS. A further lens AL can be located in the aperture. The radiation beam B then diverges and is focused by the second lens L2 (e.g., a field lens).

The projection system PS further comprises an array of lenses MLA arranged to receive the expanded modulated radiation B. Different portions of the modulated radiation beam B, corresponding to one or more of the individually controllable elements in the patterning device PD, pass through respective different lenses ML in the array of lenses MLA. Each lens focuses the respective portion of the modulated radiation beam B to a point which lies on the substrate W. In this way an array of radiation spots S is exposed onto the substrate W. It will be appreciated that, although only eight lenses of the illustrated array of lenses 14 are shown, the array of lenses can comprise many thousands of lenses (the same is true of the array of individually controllable elements used as the patterning device PD).

Figure 3:
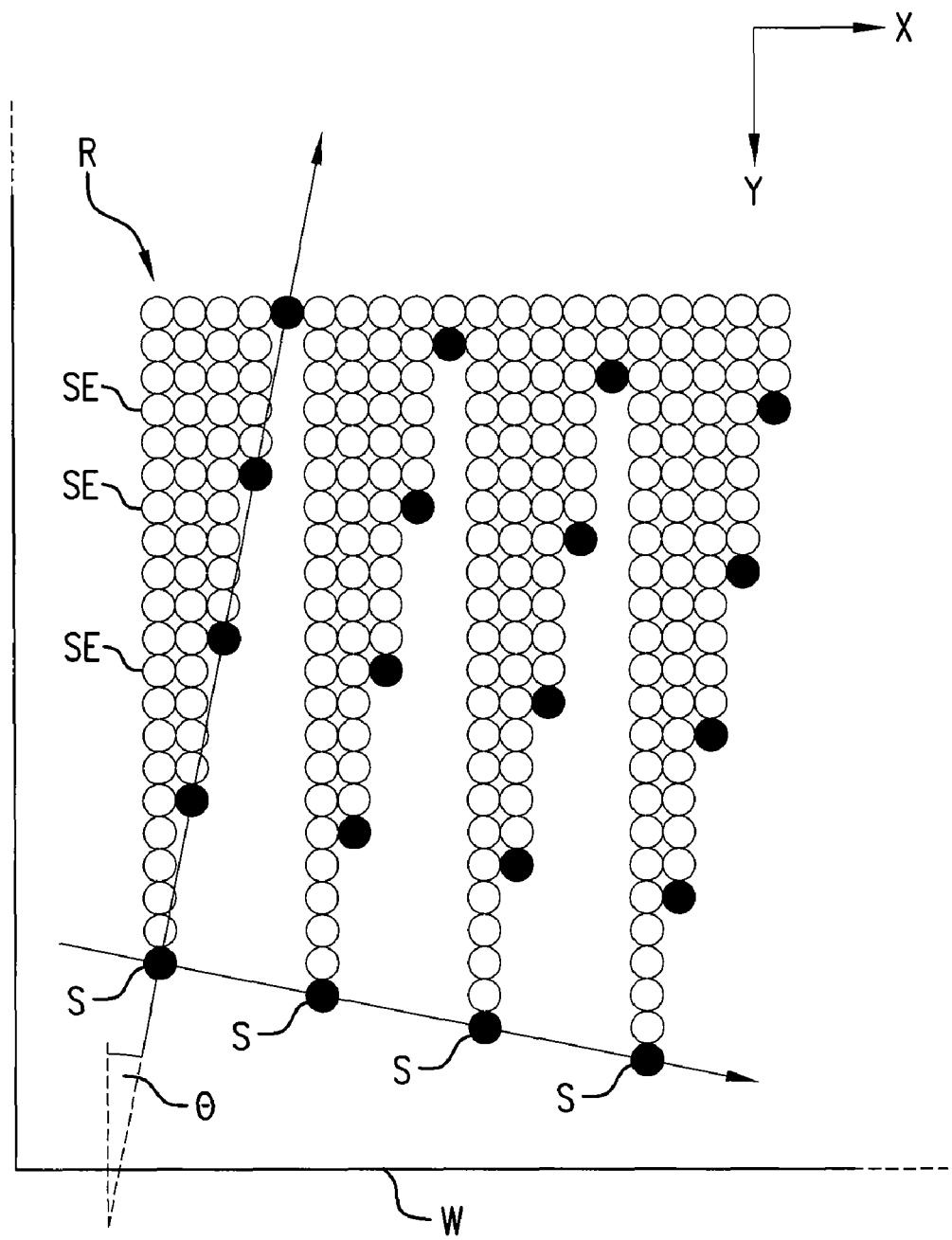
FIG. 3 depicts a mode of transferring a pattern to a substrate according to one embodiment of the invention as shown in FIG. 2.

FIG. 3 illustrates schematically how a pattern on a substrate W is generated using the system of FIG. 2, according to one embodiment of the present invention. The filled in circles represent the array of spots S projected onto the substrate W by the array of lenses MLA in the projection system PS. The substrate W is moved relative to the projection system PS in the Y direction as a series of exposures are exposed on the substrate W. The open circles represent spot exposures SE that have previously been exposed on the substrate W. As shown, each spot projected onto the substrate by the array of lenses within the projection system PS exposes a row R of spot exposures on the substrate W. The complete pattern for the substrate is generated by the sum of all the rows R of spot exposures SE exposed by each of the spots S. Such an arrangement is commonly referred to as "pixel grid imaging," discussed above.

It can be seen that the array of radiation spots S is arranged at an angle $\theta$ relative to the substrate W (the edges of the substrate lie parallel to the X and Y directions). This is done so that when the substrate is moved in the scanning direction (the Y-direction), each radiation spot will pass over a different area of the substrate, thereby allowing the entire substrate to be covered by the array of radiation spots 15. The angle $\theta$ can be at most 20°, at most 10°, at most 5°, at most 3°, at most 1°, at most 0.5°, at most 0.25°, at most 0.10°, at most 0.05°, or at most 0.01°. Alternatively, the angle $\theta$ is at least 0.001°.

Figure 4:
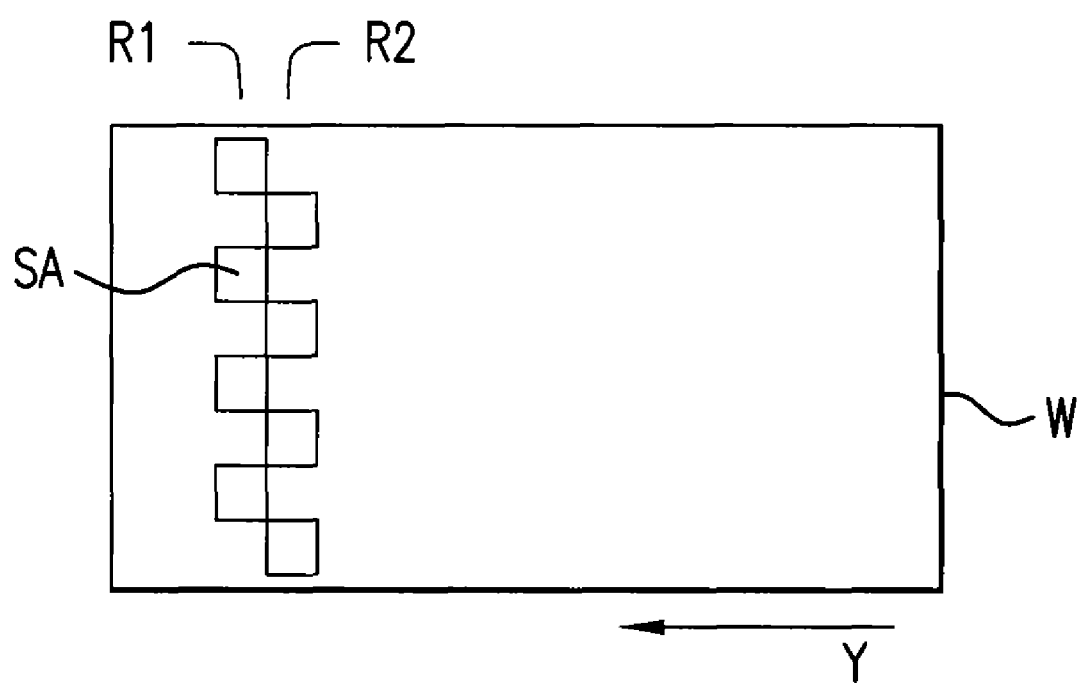
FIG. 4 depicts an arrangement of optical engines, according to one embodiment of the present invention.

FIG. 4 shows schematically how an entire flat panel display substrate W can be exposed in a single scan using a plurality of optical engines, according to one embodiment of the present invention. In the example shown eight arrays SA of radiation spots S are produced by eight optical engines (not shown), arranged in two rows R1, R2 in a "chess board" configuration, such that the edge of one array of radiation spots (e.g., spots S in FIG. 3) slightly overlaps (in the scanning direction Y) with the edge of the adjacent array of radiation spots. In one example, the optical engines are arranged in at least 3 rows, for instance 4 rows or 5 rows. In this way, a band of radiation extends across the width of the substrate W, allowing exposure of the entire substrate to be performed in a single scan. It will be appreciated that any suitable number of optical engines can be used. In one example, the number of optical engines is at least 1, at least 2, at least 4, at least 8, at least 10, at least 12, at least 14, or at least 17. Alternatively, the number of optical engines is less than 40, less than 30 or less than 20.

Each optical engine can comprise a separate illumination system IL, patterning device PD and projection system PS as described above. It is to be appreciated, however, that two or more optical engines can share at least a part of one or more of the illumination system, patterning device and projection system.

As can be seen from the above described exemplary lithographic apparatuses, a wide variety of systems and subsystems within the lithographic apparatus need to be synchronized. For example, one event around which various systems and subsystems need to be tightly synchronized is an exposure event, where the radiation beam is passed through the lithographic apparatus to the patterning device, and then the patterned beam is projected onto the substrate. At that point in time, each system and subsystem, including the illumination system IL, the patterning device PD, the substrate table WT, and the projection system PS, needs to be precisely positioned and stable. The time it takes to ready the entire lithographic apparatus between exposure events directly impacts system throughput.

It will be appreciated that the most dynamic subsystem within the lithographic device may be the patterning device PD, especially where the patterning device PD is one of the above described micro-electrical mechanical system (MEMS) such as a programmable mirror array (PMA). For instance, in optical maskless lithography, a PMA is used to form the plurality of images that are sequentially transferred to the substrate. As the lithographic operation proceeds, the exposure event must be precisely timed to correspond to correct positioning of the individual mirrors in the PMA. To that end, a system and method for synchronizing multiple nodes in a lithographic device is described below in the context of a PMA. As described more fully below, the exemplary PMA is controlled by a plurality of driver modules, which in turn receive control information from a plurality of data stores. However, the principles of operation can be extended beyond PMA synchronization to each of the plurality of systems and subsystems present in a lithographic apparatus. One only needs to define an additional local node and couple it in series (logically or physically) to the other local nodes.

Figure 5:
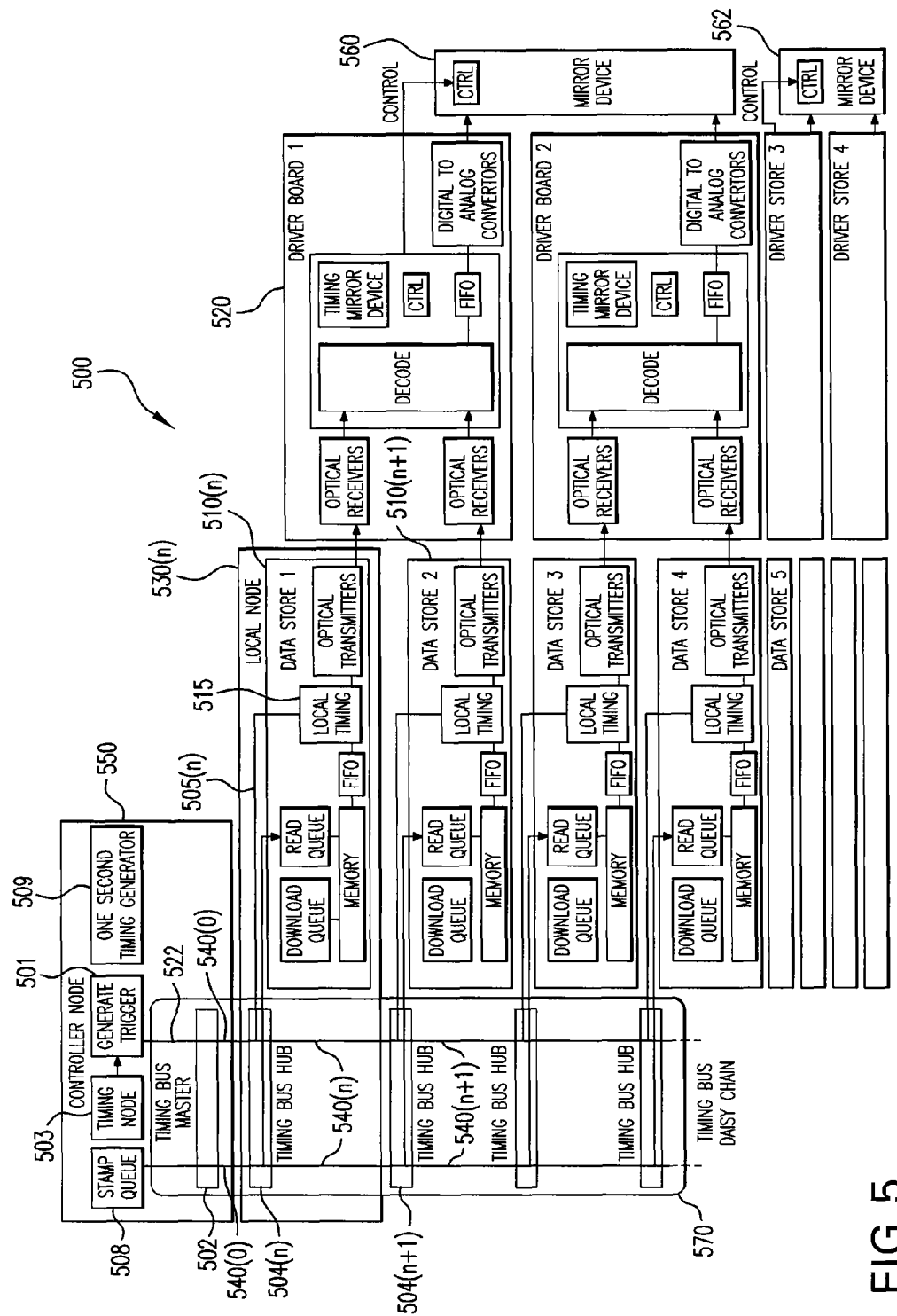
FIG. 5 depicts a portion of a control system of an exemplary lithographic apparatus.

FIG. 5 describes a portion of an exemplary optical maskless lithography system 500. Consistent with one embodiment of the present invention, the system 500 may include a controller node 550, a plurality of timing busses such as timing busses 540(0), 540(n), 540(n+1), a plurality of local nodes similar to node 530(n) that include, for example, a data store such as data store 510(n). System 500 additionally includes a plurality of driver boards 520 and a plurality of mirror devices 560, 562. The controller node 550 may include a timing node 503, a trigger generator module 501, a timing bus master 502. Controller node 550 may further include a stamp queue 508 and a one second timing generator 509. Controller node 550 is coupled to the plurality of local nodes such as node 530(n) by a timing bus daisy chain 570. In one embodiment, each local node 530(n) encompasses a timing bus hub 504(n) that may also be considered part of timing bus daisy chain 570. Details of the timing bus hubs 504 are described in more detail below.

As the name implies, timing bus daisy chain 570 is the primary conduit through which timing information is transmitted between the controller node 550 and the data stores 510. As illustrated below, other control information and data may be transmitted on timing bus daisy chain 570 as well. In an embodiment, a timing bus 540(n) may be an optical data bus. Timing bus daisy chain 570 may distribute a variety of information from the controller node 550 to the data stores and downstream clients in the optical maskless lithography data path, such as driver board 520 that controls a portion of mirror device 560. For instance, timing bus daisy chain 570 may transmit the following information:

1. Master Trigger Pulse

A master trigger pulse 522, or simply the master trigger, is the primary timing trigger that starts the transmission of data to, for example, mirror device 560 via data stores 510(n) and 510(n+1). Other triggers, such as those for setting all of the mirrors 560, 562 in a programmable mirror array to the new set points, are locally derived from this master trigger 522. For example, the master trigger 522 may be generated or produced by the trigger generator module 501 and transmitted to the timing bus master 522, which in turn propagates the master trigger pulse 522 downstream. In an embodiment, the master trigger pulse 522 may be a communication command on the timing bus hub.

2. Stamp Queue

A "stamp" queue or exposure queue 508 provides information in the form of file index numbers for each "stamp" or set of information ultimately used to a patterning device. For example, the information may correspond to an exposure event to be used by the local data stores 510 in accessing the correct data for a particular operation of a programmable mirror array such as mirror devices 560, 562.

3. Timing Parameters

Other timing parameters are derived from the master trigger 522 and transmitted along timing bus daisy chain 570 as well. For example, a timing offset ($T_{offset(0)}$) may be derived and transmitted to each of the local nodes such a local node 530(n). Additionally, a training trigger (not shown) may be used to determine Toffset(0) at the timing bus master 502 before the master trigger is sent. The training trigger can also be used to flush the file index number queues on the data stores or to flush the data path generally. Such a training trigger may also be transmitted along timing bus daisy chain 570.

4. One Second Time Stamp

According to an illustrated embodiment, a one second time stamp may be generated by the one second timing generator 509. The one second time stamp can be used, for example, as a heartbeat for the timing bus daisy chain 570. For example, if there is no timestamp received in a 2 second interval, the lack of a timestamp will be reported to a software application. This information may be used to detect a fault in a daisy chain or series connected local nodes 530. The one second time stamp may also be used to flash front board LEDs synchronously on client boards for visual status checks.

Figure 12:
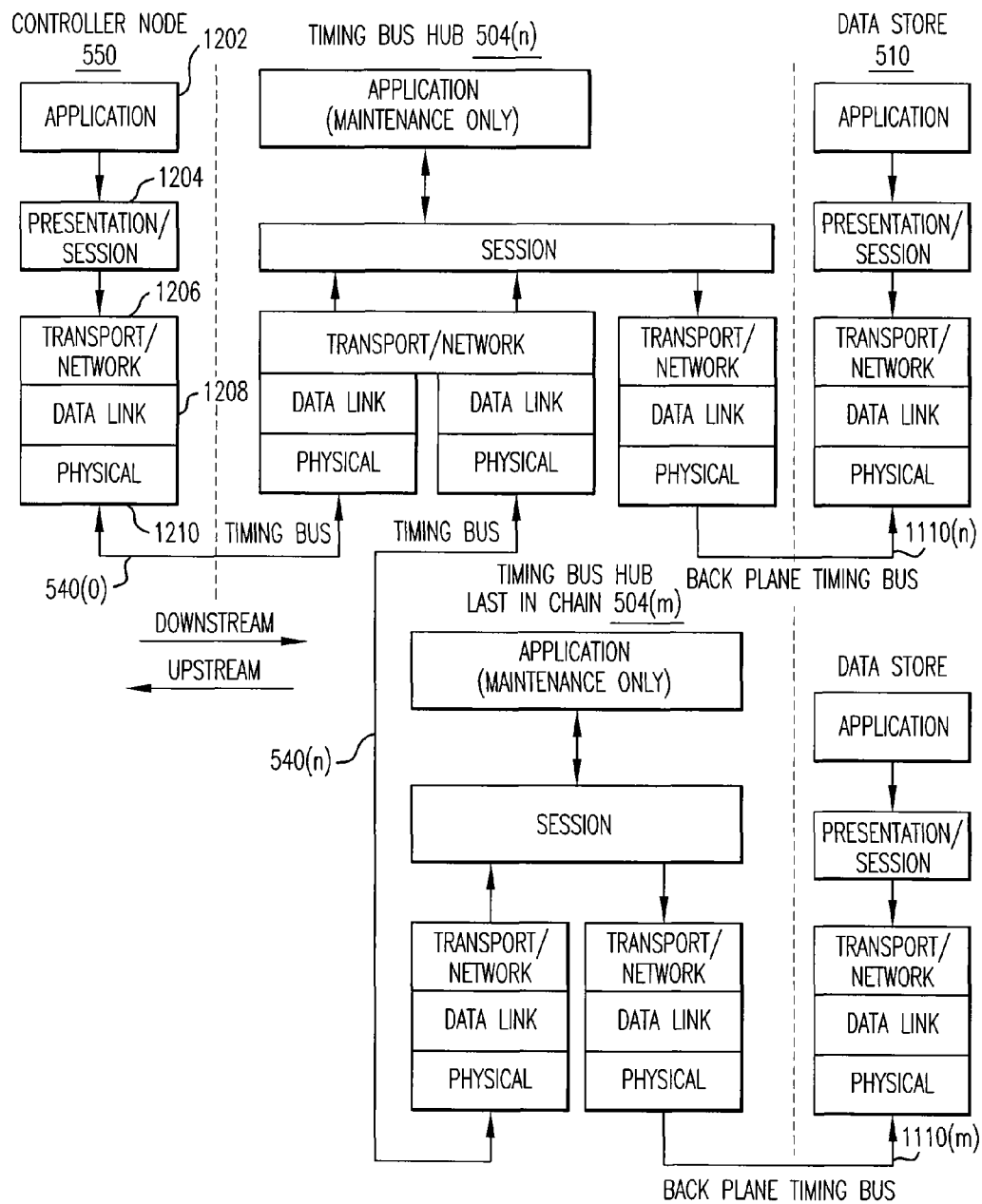
FIG. 12 depicts an exemplary topology for an arrangement of a master node and local nodes from a perspective of an open system interconnection (OSI) model.

Timing bus daisy chain 570 is specified using an exemplary seven layer open system interconnection (OSI) model. As described more fully in relation to FIG. 12, an exemplary seven layer OSI model includes a stack having an application layer 1202, a presentation/session layer 1204, a transport/network layer 1206, a data link layer 1208, and a physical layer 1210. The session layer 1204 may be used for synchronization. For timing bus 540 protocol, session layer 1204 may also be used for prioritizing information and control data, and may also be used for latency compensation of the master trigger 522. Finally, forwarding of data and control information from, for example, a timing bus hub 504(n) to local data store 510(n) will typically take place at session layer 1204

In one example, local node 530(n) includes a timing bus hub 504(n) coupled to a data store 510(n). The timing bus hub 504(n) generates a local synchronization or timing signal $T_{synch(n)}$ 505(n). The data store 510(n) includes a local timing module 515 that is responsible for local timing operations and, for example, controls the transmission of data used to control mirror device 560 based on $T_{synch(n)}$ 505(n). As explained more fully below, the timing bus hub 504(n) in local node 530(n) receives the master trigger 522 from timing bus master 502 in controller node 550. The timing bus hub 504(n) then derives the local synchronization or timing signal $T_{synch(n)}$ 505(n) to be used by the data store 510. Multiple data stores 510 are illustrated in FIG. 5, and a plurality of data stores 510 may be coupled to a single driver board 520. Driver board 520 directly controls portions of mirror device 560. As noted above, mirror device 560 may be a programmable mirror array and each of the driver boards 520 could control, for example, a portion or sector of the mirrors in the mirror array.

In FIG. 5, the data stores 510 are shown as being coupled in parallel fashion to timing bus daisy chain 570. However, for the purposes of synchronizing the plurality of data stores 510, timing signals and information, such as the master trigger 522, may be transmitted to the local nodes 504 in a daisy chain fashion—i.e., in series. This arrangement may be logically constructed by employing the concept of the local node 530(n), which as noted above, encompasses a portion of timing bus daisy chain 570 and the corresponding timing bus hub 504(n). A series arrangement may also be physically constructed. The series or daisy chain connection is described more fully below in the context of FIG. 7.

Figure 6A:
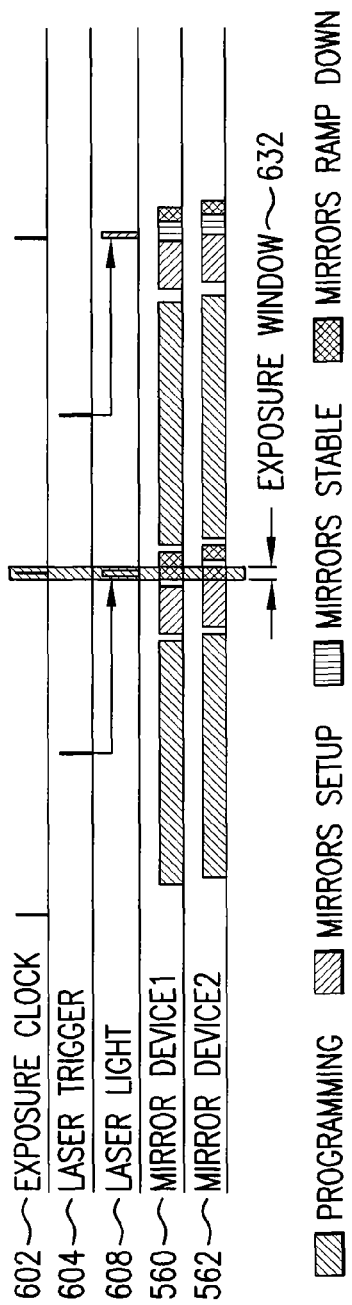
FIGS. 6A and 6B depict exemplary timing diagrams for synchronization of various subsystems in a lithographic apparatus.
Figure 6B:
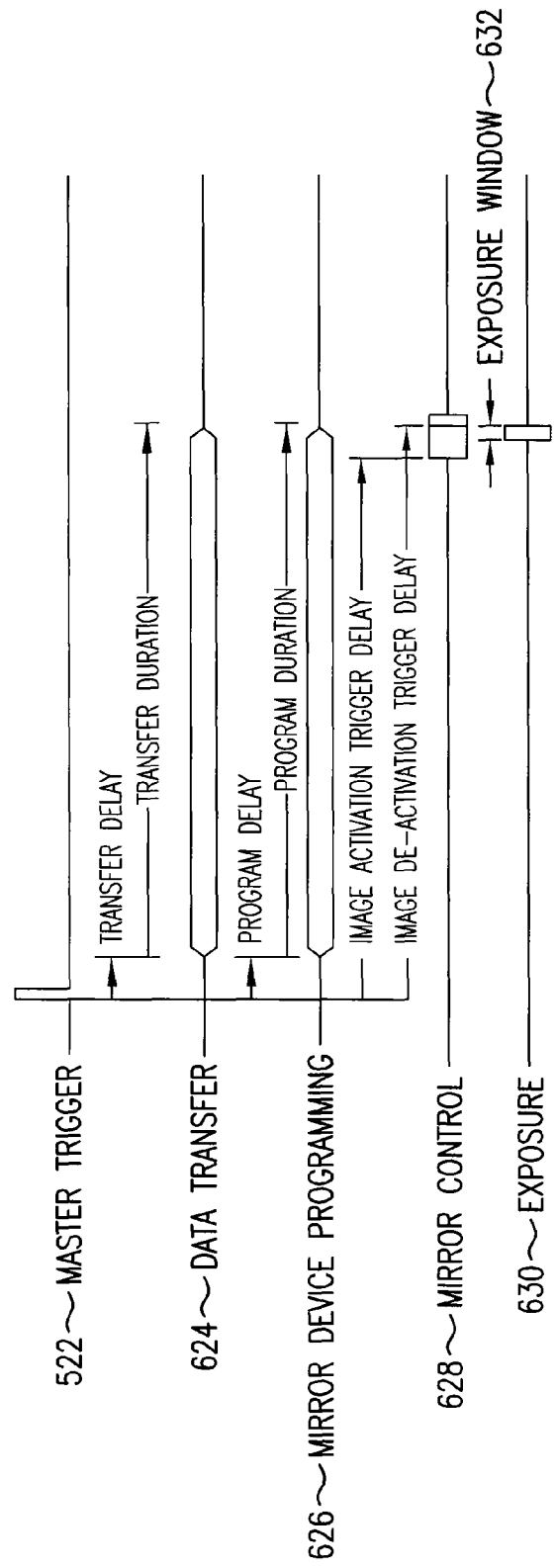

FIGS. 6A and 6B describe timing considerations in the exemplary optical maskless lithography system 500. As noted above, one event around which various systems and subsystems need to be effectively synchronized to ensure that the exposure event takes place inside the timing window or "exposure window" 632. In the exposure window 632, a radiation beam is passed through the lithographic apparatus to the patterning device, and the patterned beam is projected onto the substrate to be patterned. As illustrated in FIG. 6A, an exposure clock 602 sends a periodic signal indicating when the substrate should be exposed. The radiation beam, for example a pulsed laser beam, is initiated with laser trigger signal 604. The period of laser light 608 occurs sometime after in response to laser trigger signal 604.

Before the actual exposure occurs, however, the patterning device—e.g., mirror devices 560—needs time to receive data from its corresponding data store 510 and corresponding driver 520. That data will dictate the position and/or pattern the mirror device 560, 562 needs to take to shape the incoming radiation beam. To accomplish this, the mirror devices 560, 562 may first be addressed, set up and allowed to stabilize. Once the mirror devices 560, 562 are in a stable position, they are exposed or "stamped" with the radiation beam during the exposure window 632. Mirror devices 560 are then allowed to ramp down before beginning the next cycle, as illustrated in FIG. 6A.

While FIG. 6A pertains the timing of the exposure clock 602, the laser trigger 604, the laser light 608 and the mirror devices 560, 562, FIG. 6B corresponds to the timing of the data transfer that ideally occurs before the mirrors are properly set up. As illustrated in FIG. 6B, the master trigger pulse 522 is initiated. The master trigger 522 may set into motion the period of time during which data is transferred, for example, from data store 510 to driver board 520 of the mirror device 560. This transfer duration is illustrated by data transfer 624. Once the data transfer 624 begins, the mirror device 560 may be programmed as indicated by the mirror device program 626 in FIG. 6B. Once the mirror device 560 has been programmed, it may exert mirror control commands onto mirror device 560. This is exemplified by mirror control 628 in FIG. 6B. Once the mirrors on mirror device 560 are stable, exposure 630 may occur in exposure window 632. As illustrated next with respect to FIG. 7, an exemplary data store 510(n) includes a local timing node 515 that receives a local synchronization or timing signal $T_{synch(n)}$ 505(n), which is derived from the master trigger 522 at the corresponding timing bus hub 504(n).

Figure 7:
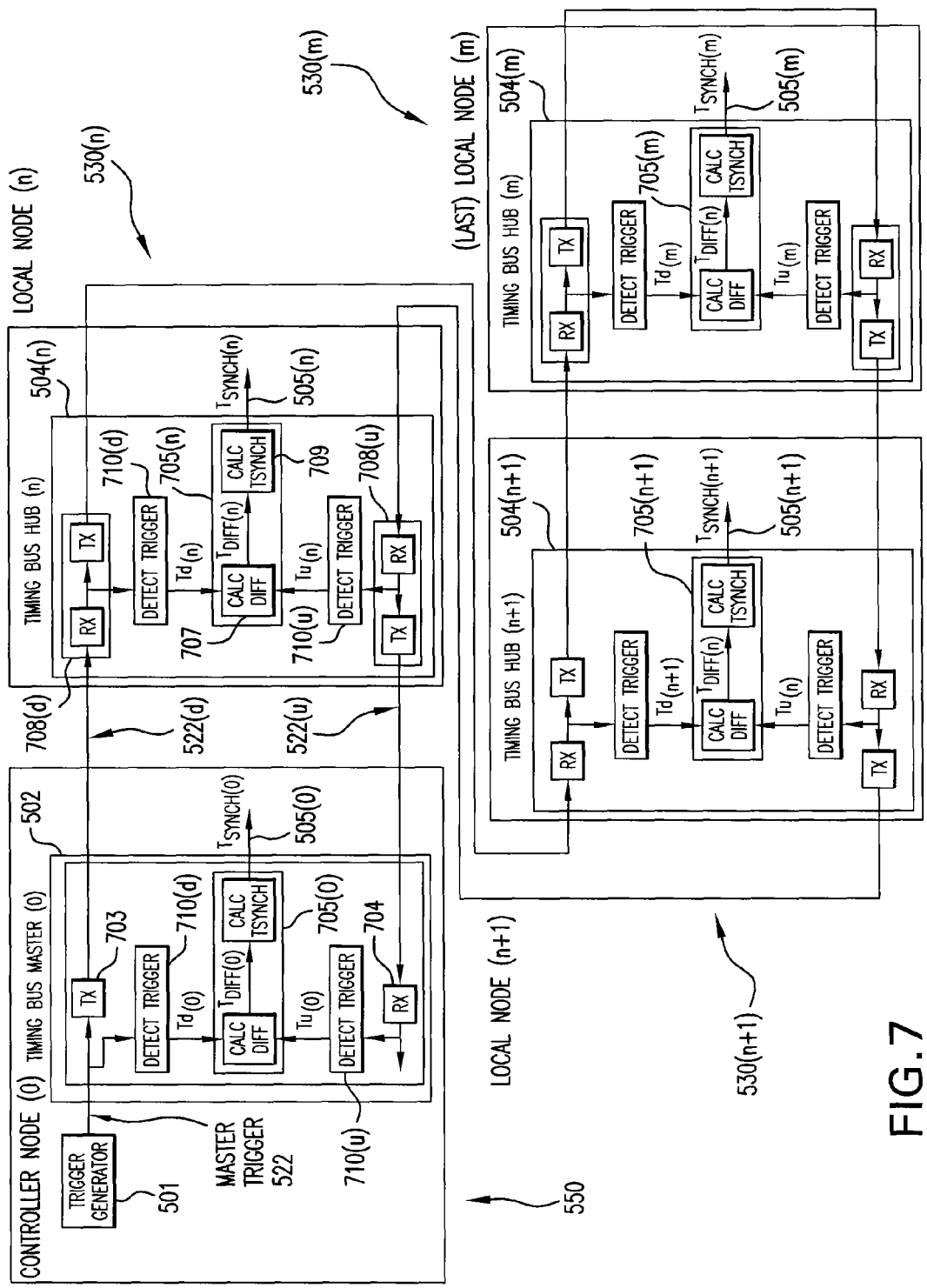
FIG. 7 depicts a simplified arrangement of a master node and a plurality of local nodes to be synchronized with the master node.

FIG. 7 illustrates an exemplary simplified local node arrangement to illustrate certain features of an embodiment of the present invention. A controller node 550 is coupled in series with subsequent local nodes 530(n), 530(n+1) through 530(m). As may be appreciated, any number of local nodes 530 may be used based on the particular application. The timing bus hubs of 504(n), 504(n+1) . . . 504(m) are coupled in series with the timing bus master 502. The series coupling may be physical as illustrated in FIG. 7. Alternatively, a series coupling may be logically accomplished through the manner in which timing information including masters trigger 522 is transmitted to the local timing bus hubs 504(n), 504(n+1) . . . 504(m). For instance, in FIG. 5, a master trigger 522 may be sequentially transmitted over timing bus daisy chain 570 from timing bus master 502 to local node 504(n), and sequentially to other local nodes (not shown in FIG. 5).

As illustrated in FIG. 7, timing bus master 502 and subsequent timing bus hubs 504(n), 504(n+1) . . . 504(m) may comprise timing compensation modules generally illustrated by elements 705(0), 705(n), 705(n+1) . . . 705(m) respectively. Controller node 550 may also include a trigger generator module 501, a transmitter 703 for transmitting a master trigger 522(d) in the downstream direction and a receiver 704 for receiving the master trigger 522(u) from an upstream direction. Timing bus master 502 and timing bus hubs 504(n), 504(n+1) . . . 504(m) may also include trigger detection modules 710(d) and 710(u) for respectively detecting downstream master trigger pulses 522(d) and upstream master trigger pulses 522(u).

Each of the local timing bus hubs 504(n), 504(n+1) . . . 504(m) may also include a set of transceivers 708. For example, local node 504(n) may comprise a downstream transceiver 708(d) that receives the downstream master trigger 522(d) from the upstream timing bus master 502 and retransmits the downstream master trigger 522(d) in the downstream direction to local node 504(n+1). Similarly, local node 504(n) also includes an upstream transceiver 708(u) that includes a receiver for receiving the upstream master trigger 522(u) from local node 504(n+1) and retransmits the upstream master trigger 522(u) to master node 502.

In one embodiment, each of the local timing bus hubs 504(n), 504(n+1) . . . 504(m) may also include a respective timing compensation module 705(n) for generating a respective local synchronization signal $T_{synch}$ 505(n) that is based on a differential measurement between the arrival of master trigger 522(d) in the downstream direction and the subsequent arrival of the master trigger 522(u) in the upstream direction. Timing compensation module 705(n) may include a differential calculation module 707 and a $T_{synch}$ calculation module 709.

An exemplary operation of the embodiment described in FIG. 7 is as follows. A master trigger 522 originates in trigger generation module 501 and may be sent through transmitter 703 in master node 502 to the downstream local node 530(n). Subsequently, the downstream transceiver 708(d) in the timing bus hub 504(n) of local node 530(n) may retransmit the master trigger 522(d) downstream to local node 530(n+1), where it is again received by a transceiver 708(d) in the local timing bus hub 504(n+1) and retransmitted to the final local node 530(m). The final local node 530(m) subsequently retransmits the master trigger 522(u) in an upstream direction through local node 530(n+1) via transceiver 708(u) in the timing bus hub 504(n+1). Local node 530(n+1) subsequently retransmits master trigger 522(u) in an upstream direction towards local node 504(n). Local node 530(n) then retransmits master trigger 522(u) back to controller node 550 via transceiver 708(u) in timing bus hub 504(n). In this fashion, the master trigger pulse is effectively sent in a loop beginning with controller node 550 around through the last local node 530(m) in the series and back to controller node 550.

In each of the local timing bus hubs 504(n), 504(n+1) . . . 504(m), the trigger detect module 710(d) may detect the master trigger 522(d) as it arrives from an upstream node—i.e., the downstream arrival time of the master trigger 522 (Td). It also may detect the master trigger 522(u) as it arrives from a downstream node—i.e., the upstream arrival time of the master trigger 522 (Tu). Differential calculation module 707 calculates the difference in the arrival time between the upstream master trigger and the downstream master trigger—i.e., $T_{diff}$=Tu−Td. As illustrated in more detail below, the differential measurement between the arrival of the downstream master trigger (Td) and the upstream master trigger (Tu) is used to generate through the $T_{synch}$ calculation module 709 a local synchronization or timing signal $T_{synch}$ 505. The $T_{synch}$ 505 signal will start the data transfer process, which, in turn, will trigger image programming and subsequent activation of the mirror device 560 via driver 520.

Figure 8:
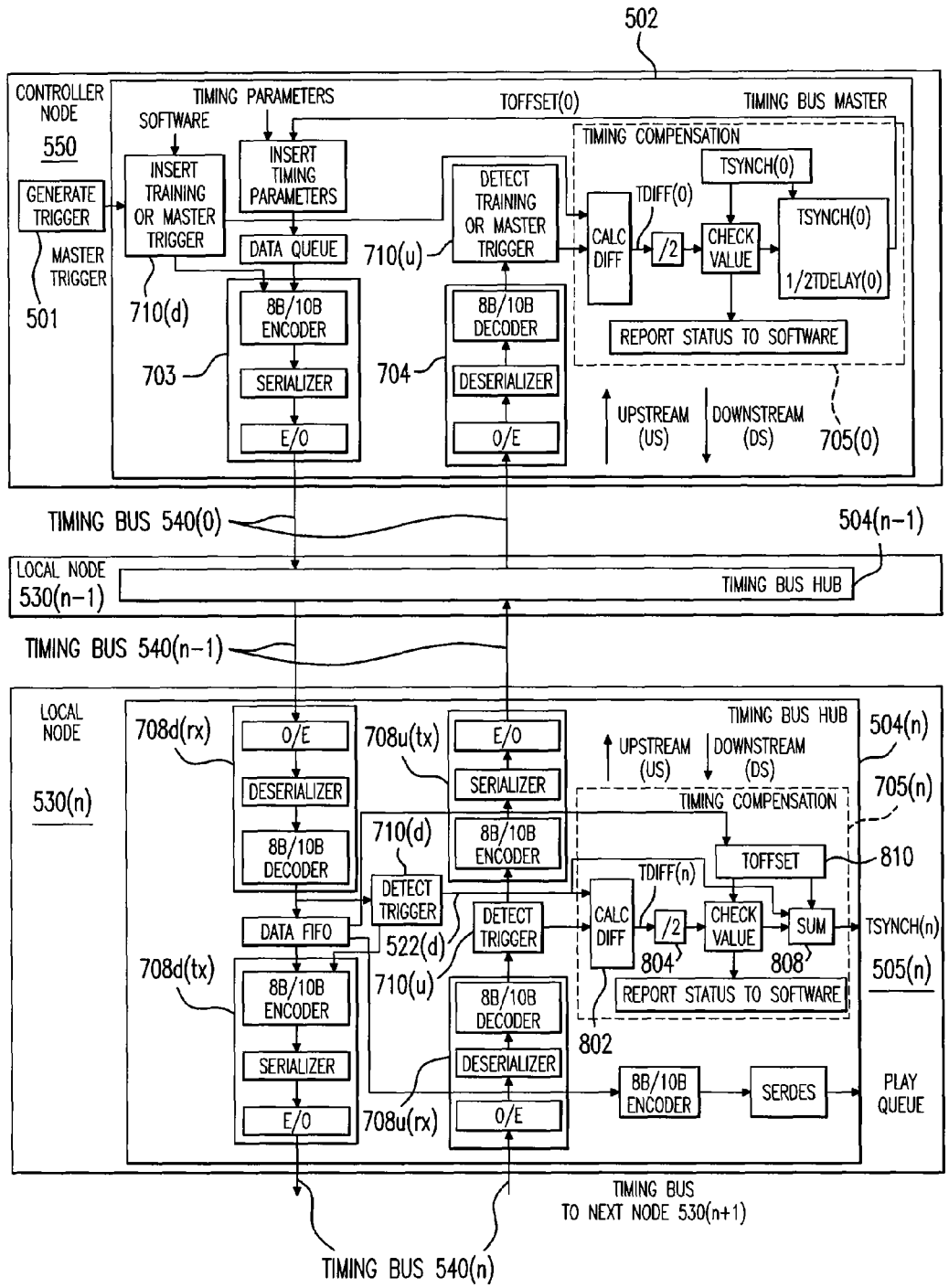
FIG. 8 depicts a more detailed representation of a master node and a local node.

FIG. 8 illustrates in more detail controller node 550 and a local node 530(n). As illustrated, timing bus daisy chain 570 provides the physical link between the timing bus master 502 and a local timing bus hub 504(n). As illustrated, timing bus master 502 may comprise a master transmitter 703 including may be an 8B/10B encoder, a serializer module and an electrical to optical conversion module (E/O). Similarly, timing bus master 502 comprises a receiver 704 including may be an optical to electrical (O/E) conversion module a deserializer and an 8B/10B decoder.

FIG. 8 also illustrates in more detail a portion of the controller node 550 having timing bus master 502 and a portion of local node 530(n) having timing bus hub 504(n) that could represent, for example, a the local node encompassing a local data store 510(n). In timing bus hub 504(n), a receiver portion of the downstream transceiver 708(d)(rx) is illustrated, as is a transmitter portion 708(d)(tx). The transmitter portion includes, for example, an 8B/10B encoder, a serializer module and an electrical to optical (E/O) conversion module that are appropriately configured for their function. The receiver portion includes, for example, an 8B/10B decoder, a deserializer module and an optical to electrical (O/E) conversion module that are appropriately configured for their function. An upstream transceiver is similarly illustrated by 708u(tx) and 708u(rx).

Additionally, FIG. 8 illustrates a trigger detection module 710(d) for detecting the arrival of the downstream master trigger pulses 522(d) and a trigger detection module 710(u) for detecting the arrival of upstream master trigger pulses 522(u). Trigger detection modules 710(d) and 710(u) are both coupled to timing compensation module 705(n). In particular, they are coupled to a differential calculator 802 for determining the difference in the arrival time between the upstream master trigger 522(u) and the downstream master trigger 522(d)—i.e., $T_{diff}$=Tu−Td. The result $T_{diff}$ is divided by 2 in a "/2" module 804 to determine an average arrival time of the master trigger Finally, the local synchronizing or timing signal $T_{synch}$ 505(n) is determined by summing module 808 as described more fully below. In one embodiment, the local synchronization time 505(n) for a local node 530(n) may be represented by the equation $T_{synch(n)} = Td_n + (1/2*T_{diff(n)}) + T_{offset}$. In an alternate embodiment, the local synchronization time 505(n) for a local node 530(n) may be represented by the equation $T_{synch(n)} = Tu_n - (1/2*T_{diff(n)}) + T_{offset}$.

The offset $T_{offset}$ 810 may be greater than or equal to a worst case offset, which is the largest $T_{offset} = 1/2*T_{diff(n)}$ for all of the local nodes 530 in the system 500. In one embodiment, offset $T_{offset}$ 810 may be determined by sending a training trigger before sending a real master trigger 522. Additionally, the timing bus master 502 may also calculates a local $T_{synch}$. The offset $T_{offset}$ 810 could also be determined by analyzing the master trigger 522 immediately preceding the current master trigger 522. Finally, the offset $T_{offset}$ 810 may be programmed by a user to meet the specific needs of a particular system or subsystem.

In an alternate embodiment, each of the plurality of local nodes may be synchronized to an absolute moment in a time domain of the timing bus master ($T_{synch(0)}$). First, a timing bus master differential time ($T_{diff(0)}$) is calculated wherein $T_{diff(0)} = Tu_0 - Td_0$. Then, an offset ($T_{offset(0)}$) is calculated wherein $T_{offset(0)}$ equals either $[(T_{synch(0)} - Td_0) - \frac{1}{2}T_{diff(0)}]$ or $[(T_{synch(0)} - Tu_0) + \frac{1}{2}T_{diff(0)}]$. Finally, $T_{offset(0)}$ is distributed to each local node where it may be used as $T_{offset}$ as illustrated in FIG. 8.

Figure 9:
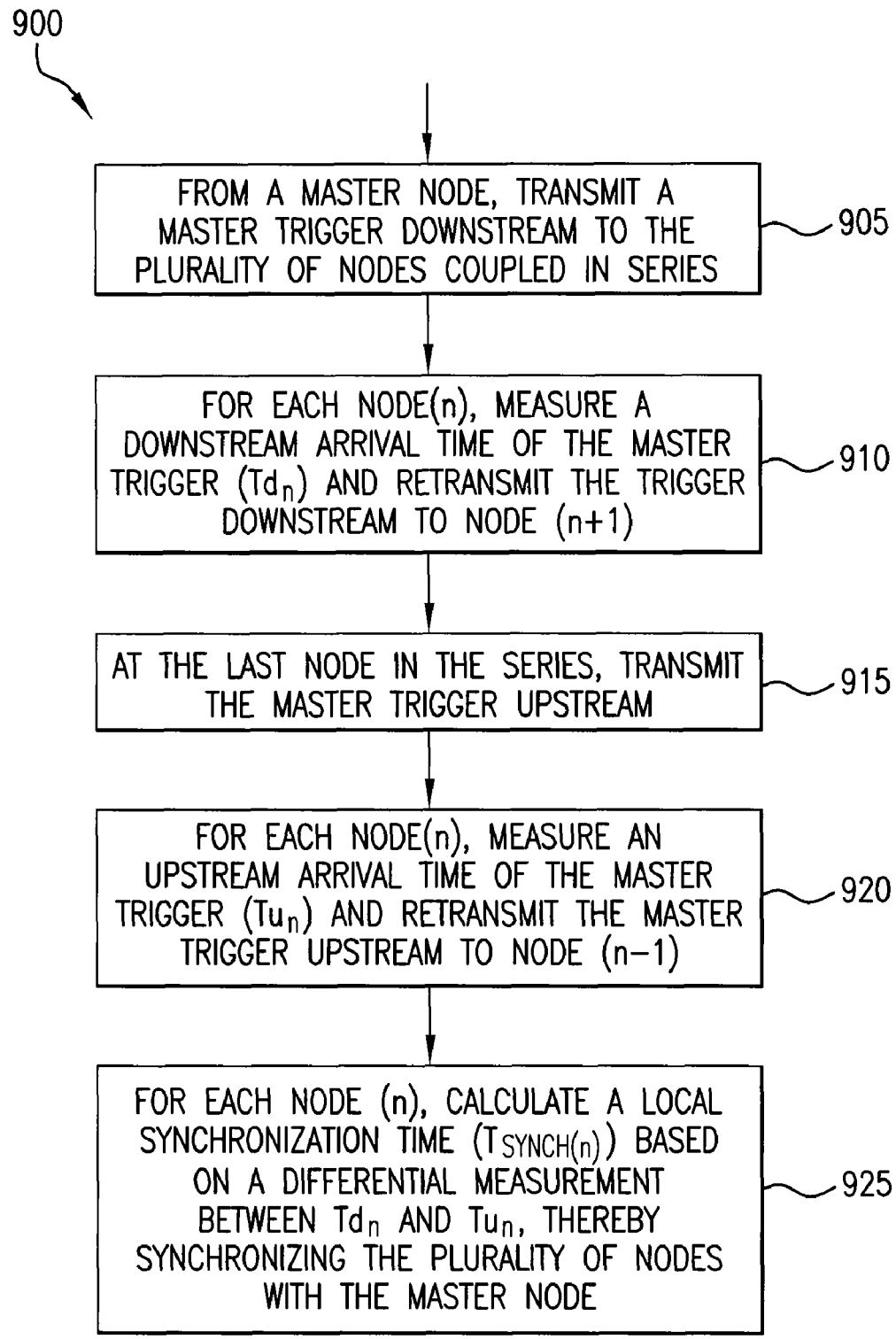
FIG. 9 is a flow chart depicting an exemplary method for synchronizing a plurality of nodes.

FIG. 9 is a flow chart illustrating an embodiment of the present invention, and represents a method for synchronizing a plurality of nodes. As shown in step 905, a trigger is transmitted from controller node 550—via the timing bus master 502—downstream to a plurality of local nodes 530 coupled in series. As noted above, the topology of the timing bus master and local nodes may be physically coupled in series or in a "daisy chain" topology. Alternatively, the series topology may be logically implemented. Furthermore, the local nodes 530 may enable a hub for a number of clients, such as the data stores 510 described above in relation to FIG. 5. Such an embodiment is described below in the context of FIG. 11.

Next, in step 910, for each local node (n), a downstream arrival time of the master trigger ($Td_n$) is measured and the master trigger 522(d) is retransmitted downstream to node (n+1). This may be accomplished by the respective plurality of timing bus hubs 504. At the last local node in the series 530(m), the master trigger 522 is transmitted upstream according to step 915. Step 920 is similar to step 910, but in the reverse direction. More specifically, in step 920, for each local node (n), an upstream arrival time of the master trigger ($Tu_n$) is measured and the master trigger 522(u) is retransmitted upstream to local node (n−1). In this fashion, the master trigger 522 is transmitted through the daisy chain topology to the last local node 530(m) in the series, and retransmitted back to the controller node 550. In this fashion, the differential time between the arrival of the master trigger in the downstream and upstream directions may be evaluated. This differential time may be used to derive a local synchronization time upon which local operations may be based.

More specifically, according to step 925, for each local node(n), a local synchronization time ($T_{synch(n)}$) is calculated based on a differential measurement between $Td_n$ and $Tu_n$. The local synchronization time is used to synchronize the local node with the timing bus master. The local operations will occur at $T_{synch(n)}$, thereby ensuring that a local node 530(n) is synchronized with controller node 550.

Figure 10:
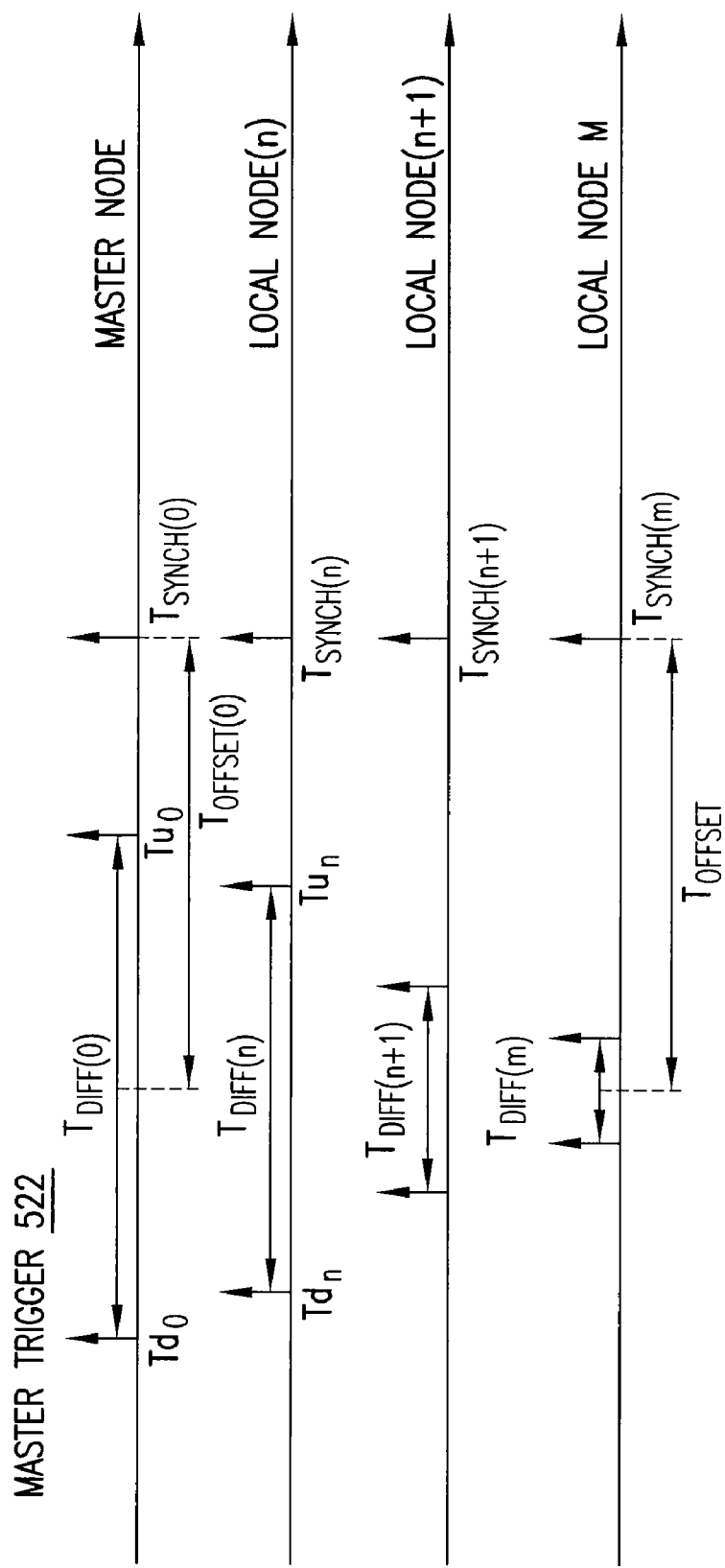
FIG. 10 depicts a simplified timing diagram corresponding to the method illustrated in FIG. 9.

FIG. 10 graphically illustrates the method described above corresponding to FIG. 9. A master trigger 522 is sent downstream at time $Td_0$. The arrival of master trigger 522 at local node (n) is illustrated by $Td_n$. The subsequent arrival of master trigger 522 at local node (n+1) is illustrated by time $Td_{(n+1)}$ and finally the arrival of the downstream master trigger at the last local node (m) is illustrated by time $Td_m$. The retransmission of master trigger 522 in the upstream direction is occurs at time $Tu_m$. As illustrated in FIG. 10, the upstream arrival of the master trigger is similarly indicated for subsequent local nodes (n+1) and (n), finally ending with the arrival of the master trigger in the upstream direction at the timing bus master.

At the timing bus master 502 and at each local timing bus hub 504, a differential time is calculated. Consistent with one exemplary embodiment of the present invention, the differential times are graphically represented in FIG. 10 by $T_{diff(0)}$ for the timing bus master 502, $T_{diff(n)}$ for local timing bus hub 504(n), $T_{diff(n+1)}$ for local timing bus hub 504 (n+1) and $T_{diff(m)}$ for the last local timing bus hub 504(m). As may be seen, the differential time $T_{diff}$ becomes smaller for each successive local timing bus hub 504 and respective local node 530. The differential time $T_{diff}$, which represents the differential time between the arrival of the downstream and upstream master trigger pulses, is then used to generate a local synchronization time $T_{synch}$ for each downstream local node in the manner described above. If each local node 530(n) then conducts its local operations at $T_{synch(n)}$, the local nodes 530(n)-530(m) will be synchronized with controller node 550.

Figure 11:
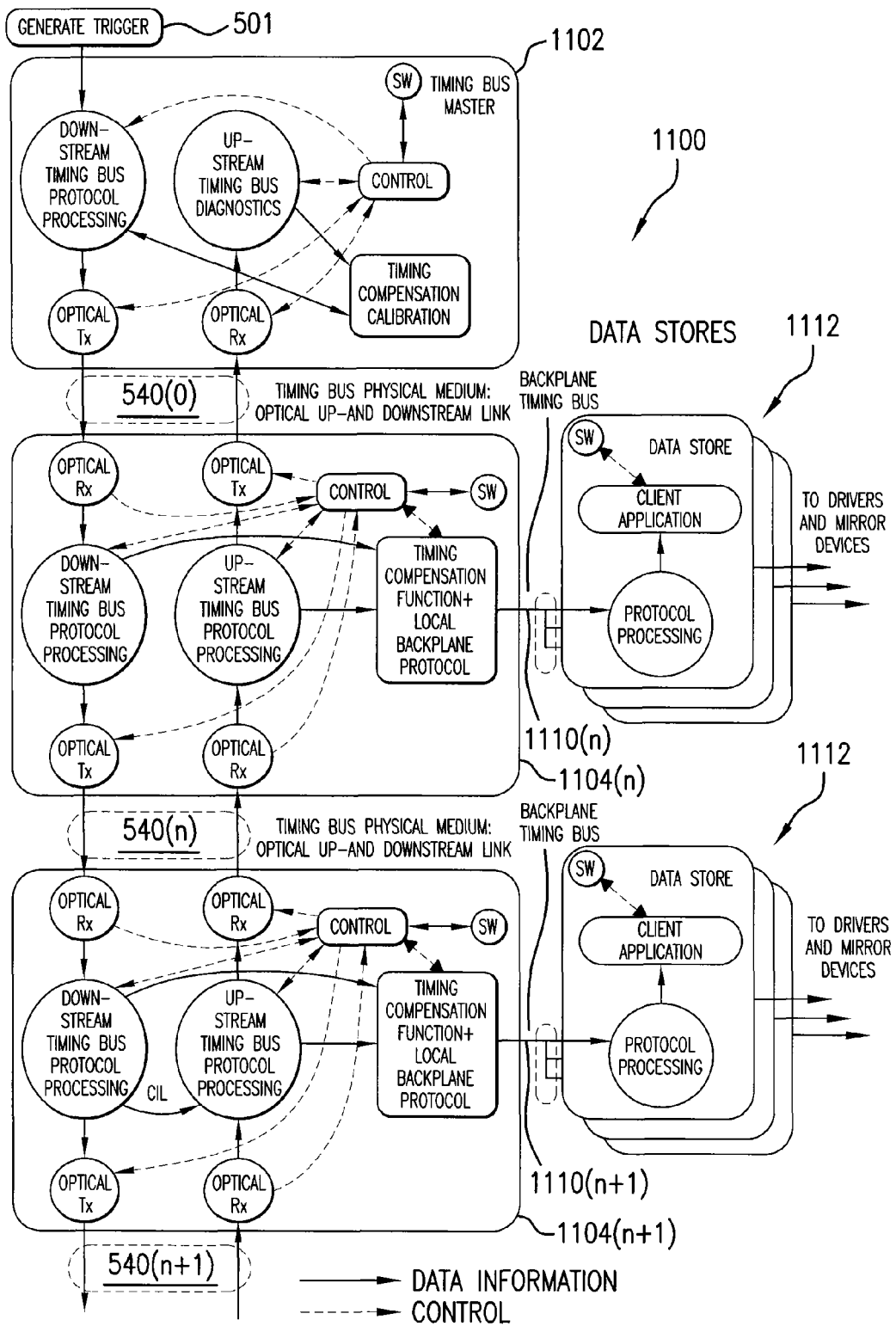
FIG. 11 depicts an alternative topology for an arrangement of a master node and local nodes.

FIG. 11 illustrates an alternate embodiment of the present invention, in which there are a plurality of timing hub nodes synchronized to a timing bus master 1102. For example, timing hub 1104(n) and timing hub 1104(n+1) are synchronized to a timing bus master 1102. Timing hubs 1104(n) and 1104(n+1) represent timing nodes that may be logically established to control the timing of various local nodes. As illustrated, each timing hub 1104(n) and 1104(n+1) has a set of optical receivers and transmitters for receiving and retransmitting the master trigger in the downstream direction to the last hub node and again in the upstream direction returning to the timing bus master 1102. A back plane timing bus 1110(n) couples a timing hub 1104(n) to a plurality of client devices. Exemplary client devices could be, for example, data stores 1112.

The above illustrated system and method for synchronizing local nodes with a timing bus master is premised on physically or logically linking the timing bus master and local nodes in a series or "daisy chain" topography. A master trigger is sent downstream and back upstream through the daisy chain to evaluate a differential measurement between the arrival of the downstream and upstream master trigger pulses. A local timing signal is then generated based on the differential measurement. This is essentially a time moment in a local time domain.

The daisy chain topology of the embodiments of the present invention allows for a scalable system. For instance the physical distance between the nodes may be changed at no cost in the timing accuracy as the static timing compensation is done automatically of each connection. The same is not true for parallel or "star" topology because a new link may introduce, for example, a 5 to 7 ns delay per meter of optical cabling. Because of this scalability according to embodiments of the present invention, more nodes will only increase the maximal achievable timing skew between the local nodes. Additionally, when the timing bus master receives the master trigger back from local nodes, the timing bus master may be sure that each local node has received the trigger, thereby continually verifying the continuity of the daisy chain topology and thereby ensuring that the local nodes have received the trigger.

It should also be noted that the first local node or timing bus hub in the daisy chain topology will likely be the most accurate vis-à-vis being synchronized with the controller node's timing bus master, and the last local node or timing hub may likely be less accurate. One may use this property to optimize the system. For example, the node or timing hub that requires the tightest timing margins may be established (logically or physically) as the first local node, while the local node or timing hub that has the most relaxed timing requirements may be established as the last in the daisy chain topology. Finally, the worst case difference in timing signals $T_{synch(n)}$ and $T_{sync(n-1)}$ is always equal. This feature may be exploited in the system as it enables synchronizing multiple local systems even more accurately. For OML in particular, this feature allows for a reduction in elastic buffer sizes needed to compensate for local timing differences as multiple stores are needed to drive a single mirror device. For example, it is important to have very accurate timing between data stores that drive a single mirror device, even more so than between data stores that drive two different mirror devices.

Although specific reference may be made in this text to the use of lithographic apparatus in the manufacture of a specific device (e.g., an integrated circuit or a flat panel display), it should be understood that the lithographic apparatus described herein may have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), light emitting diodes (LEDs), etc. Also, for instance in a flat panel display, the present apparatus may be used to assist in the creation of a variety of layers, e.g., a thin film transistor layer and/or a color filter layer.

Although specific reference is made above to the use of embodiments of the invention in the context of optical lithography, it will be appreciated that the invention may be used in other applications, for example imprint lithography, where the context allows, and is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

CONCLUSION

While various embodiments of the present invention have been described above, it should be understood that they have been presented by way of example only, and not limitation. It will be apparent to persons skilled in the relevant art that various changes in form and detail may be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections may set forth one or more, but not all exemplary embodiments of the present invention as contemplated by the inventor(s), and thus, are not intended to limit the present invention and the appended claims in any way.

What is claimed is:

1. A method for synchronizing a plurality of nodes in a lithography system, comprising:
   from a controller node in the lithography system, transmitting a master trigger downstream to first and second local nodes in the lithography system coupled in series;
   measuring a downstream arrival time of the master trigger ($Td_n$) at the first one of the local nodes (n) and retransmitting the master trigger downstream to the second one of the local nodes (n+1);
   transmitting the master trigger upstream from the second one of the local nodes (n+1) to the first one of the local nodes (n);
   measuring an upstream arrival time of the master trigger ($Tu_n$) from the second one of the local nodes (n+1) at the first one of the local nodes (n) and retransmitting the master trigger upstream to the controller node; and
   calculating a local synchronization time signal ($T_{synch(n)}$) based on a differential measurement between $Td_n$ and $Tu_n$, thereby synchronizing the first and second local nodes with the controller node.

2. The method of claim 1, wherein the calculating of the local synchronization time ($T_{synch(n)}$) further comprises:
   calculating a local differential time for each local node ($T_{diff(n)}$) wherein $T_{diff(n)} = Tu_n - Td_n$;
   determining an offset ($T_{offset}$); and
   wherein the local synchronization signal $T_{synch(n)}$ equals either $[Td_n + (½ * T_{diff(n)}) + T_{offset}]$ or $[Tu_n - (½ * T_{diff(n)}) + T_{offset}]$.

3. The method of claim 2, wherein the offset $T_{offset}$ is greater than or equal to one half of the local differential time $T_{diff(1)}$ for the first local node in the series.

4. The method of claim 3, further comprising: transmitting the master trigger to the first and second local nodes on a first bus; and transmitting the offset ($T_{offset}$) to the first and second local nodes on a second bus.

5. The method of claim 2, wherein the local differential time $T_{diff(n)}$ is predetermined by transmitting a training trigger to the local nodes.

6. The method of claim 5 wherein the training trigger is a previously sent master trigger.

7. The method of claim 1, further comprising calculating a local synchronization time for the controller node $T_{synch(0)}$ based on a differential measurement between master trigger transmission $Td_0$ and arrival of the master trigger at the master node from an upstream direction $Tu_0$.

8. The method of claim 1, further comprising assessing continuity of the first and second local nodes by determining whether each of the first and second local nodes received the master trigger based on arrival of the master trigger at the controller node in an upstream direction.

9. The method of claim 1, further comprising synchronizing each of the first and second local nodes to an absolute moment in a time domain of the master node ($T_{synch(0)}$) by (i) calculating a controller node differential time ($T_{diff(0)}$) wherein $T_{diff(0)} = Tu_0 - Td_0$; (ii) calculating an offset ($T_{offset(0)}$) wherein $T_{offset(0)}$ equals either $[(T_{synch(0)} - Td_0) - ½T_{diff(0)}]$ or $[(T_{synch(0)} - Tu_0) + ½T_{diff(0)}]$; and
   distributing $T_{offset(0)}$ to each of the first and second local nodes.

10. A method for synchronizing a plurality of series coupled nodes in a lithography system, comprising:
    transmitting a master trigger through the plurality of series coupled local nodes in the lithography system in a downstream direction from a first local node to a last local node;
    retransmitting the master trigger through the plurality of series coupled nodes in an upstream direction from the last node to the first node; and
    calculating a local synchronization time at each of the plurality of nodes based on a differential measurement between the arrival of the master trigger in the downstream direction and the upstream direction.

11. A synchronized system for controlling a patterning device in a lithography system, comprising:
    a controller node in the lithography system that includes a transmitter that transmits a downstream master trigger, and a receiver that receives an upstream master trigger; and
    first and second successive downstream local nodes in the lithography system coupled in series with the controller node, each first and second local nodes having a downstream transceiver that receives and retransmits the master trigger in a downstream direction, and an upstream transceiver that receives and retransmits the master trigger in an upstream direction;

wherein the controller node and the first and second local nodes each include (i) a trigger detector that detects an arrival of the master trigger in both the downstream direction and the upstream direction, and (ii) a timing compensation module that generates a local timing signal based on a differential measurement between the arrival of the master trigger in the upstream direction and the arrival of the master trigger in the downstream direction; and whereby the local timing signals are synchronized with the master signal to control operation of the patterning device.

12. The system of claim 11, wherein the local timing signal includes a software programmable offset.

13. The system of claim 11, wherein the first and second successive downstream local nodes are logically coupled in series.

14. The system of claim 11, wherein the first and second of successive downstream local nodes are physically coupled in series.

15. A lithography system, comprising:

an illumination system configured to produce one or more beams of radiation;

a patterning device configured to pattern the one or more beams of radiation, the patterning device receiving control information from a plurality of local nodes, wherein the local nodes are coupled in series and are configured to transmit a master trigger in a downstream direction from a first local node to a last local node;

retransmit the master trigger in an upstream direction from the last local node to the first local node; and generate a local timing signal at each of the plurality of local nodes based on a differential measurement between the arrival of the master trigger in the downstream direction and the upstream direction, and wherein the patterning device receives synchronized control information according to the plurality of local timing signals; and a projection system configured to project the one or more patterned beam onto a target portion of a substrate.

16. The system of claim 15, wherein the patterning device receives control information from a plurality of data stores, each data store having a local node that respectively generates the local timing signal.

17. The system of claim 15, wherein each of the local nodes is coupled to a plurality of data stores, and the plurality of data stores provide information to the patterning device based on the plurality of local timing signals.

18. The system of claim 15, wherein the local timing signal includes a software programmable offset.

19. The system of claim 15, wherein the plurality of local nodes are logically coupled in series.

20. The system of claim 15, wherein the plurality of local nodes are physically coupled in series.

* * * * *